(12) United States Patent
Choi

(10) Patent No.: US 7,956,351 B2
(45) Date of Patent: Jun. 7, 2011

(54) ORGANIC LIGHT EMITTING DEVICE AND METHOD FOR FABRICATING THE SAME

(75) Inventor: Hee Dong Choi, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 806 days.

(21) Appl. No.: 11/644,049

(22) Filed: Dec. 22, 2006

(65) Prior Publication Data

US 2007/0284595 A1 Dec. 13, 2007

(30) Foreign Application Priority Data

Jun. 12, 2006 (KR) .......................... 10-2006-0052549

(51) Int. Cl.
*H01L 51/52* (2006.01)
*H01J 1/88* (2006.01)

(52) U.S. Cl. .................. 257/40; 257/E51.019; 313/512

(58) Field of Classification Search .................. 257/40, 257/59, 72, E51.018–E51.021; 313/504–506, 313/512; 345/76, 80
See application file for complete search history.

(56) References Cited

U.S. PATENT DOCUMENTS

| | | | | |
|---|---|---|---|---|
| 5,701,055 A | * | 12/1997 | Nagayama et al. | 313/504 |
| 5,773,931 A | * | 6/1998 | Shi et al. | 313/509 |
| 6,140,765 A | * | 10/2000 | Kim et al. | 313/506 |
| 6,664,730 B2 | * | 12/2003 | Weaver | 313/504 |
| 7,122,956 B2 | * | 10/2006 | Ikeda et al. | 313/504 |
| 2003/0205970 A1 | * | 11/2003 | Park et al. | 313/506 |
| 2004/0160176 A1 | * | 8/2004 | Kim | 313/506 |
| 2006/0119259 A1 | * | 6/2006 | Bae et al. | 313/506 |

FOREIGN PATENT DOCUMENTS

| | | |
|---|---|---|
| CN | 1455629 A | 11/2003 |
| EP | 888035 A1 * | 12/1998 |

OTHER PUBLICATIONS

Office Action issued in corresponding Chinese Patent Application No. 200610164533.9; issued Nov. 14, 2008.

* cited by examiner

*Primary Examiner* — Matthew W Such
(74) *Attorney, Agent, or Firm* — Brinks Hofer Gilson & Lione

(57) ABSTRACT

An organic light emitting device includes a first electrode disposed on a first substrate and comprising an emission area and an non-emission area, a plurality of barrier ribs located on a portion of the non-emission area of the first electrode, each barrier rib having an overhang structure, auxiliary electrodes disposed on a portion of a lower part of the barrier ribs and electrically contacting the first electrode, an emission layer disposed on the emission area of the first electrode and a second electrode disposed on the emission layer.

9 Claims, 4 Drawing Sheets

ORGANIC LIGHT EMITTING DEVICE AND METHOD FOR FABRICATING THE SAME

CROSS-REFERENCE

This application claims priority to and the benefit of Korea Patent Application No. 2006-0052549 filed on Jun. 12, 2006, the entire content of which is incorporated herein by reference.

BACKGROUND

1. Technical Field

The present invention relates to an organic light emitting device and a method for fabricating the same.

2. Related Art

Among flat panel display devices, light emitting device has an advantage in that it has high response speed and low power consumption. The light emitting device can also be manufactured thin in size and light in weight because of not requiring backlights.

In particularly, organic light emitting device has an organic light emitting layer between an anode and a cathode. Holes from the anode and electrons from the cathode are combined within the organic light emitting layer to create hole-electron pairs, i.e., excitons. The organic light emitting device emits lights by energy generated while the excitons return to ground state.

The organic light emitting device comprises a plurality of sub-pixels which have red, green, and blue emission layers to display full colored images. And, barrier ribs can be used to form red, green, or blue emission layer in each sub-pixel.

FIG. 1A is a cross sectional view of an organic light emitting device according to a prior art.

Referring to FIG. 1A, a light emitting diode 190 comprising a first electrode 150, an emission layer 180, and a second electrode 185 is disposed on a substrate 140.

The first electrode 150 may be an anode, and may be deposited with a transparent conductive film such as Indium Tin Oxide and then be patterned in the form of multiple stripes.

An insulating layer 160 is disposed on the first electrode 150, which comprises an opening 165 for exposing the first electrode 150, and a barrier rib 170 is disposed on the insulating layer 160 in the form of an overhang. The emission layer 180 is disposed in the opening 165 and a second electrode 185 is disposed on the emission layer 180. The emission layer 180 and the second electrode 185 are patterned by the barrier rib 170 having the form of an overhang.

FIG. 1B is a cross sectional view of an organic light emitting device according to another prior art.

Referring to FIG. 1B, a thin film transistor T comprising a semiconductor layer 105, a gate insulating layer 110, a gate electrode 115, a inter-insulating layer 120, a source electrode and a drain electrode 125a, 125b is disposed on a first substrate 100.

A second substrate 140 is located to oppose the first substrate 100. A light emitting diode 190 comprising a first electrode 150, an emission layer 180, and a second electrode 185 is disposed on the second substrate 140.

The first electrode 150 may be an anode, and the first electrode 150 may be a common electrode which is substantially formed on a full surface of the second substrate 140. The first electrode 150 may comprise a transparent conductive material such as Indium Tin Oxide. An insulating layer 160 is disposed on the first electrode 150, which comprises openings 165 for exposing the first electrode 150, and barrier ribs 170 are disposed on the insulating layer 160 in the form of an overhang. The emission layers 180 are disposed in the openings 165 and second electrodes 185 are disposed on the emission layers 180. The emission layers 180 and the second electrodes 185 are patterned by the barrier rib 170 having the form of an overhang.

When the first substrate 100 and the second substrate 140 are attached to each other, a drain electrode 125b of the first substrate 100 and the second electrode 190 of the second substrate 140 are electrically connected to each other by a metal line 195. Accordingly, the light emitting diode 190 provided on the second substrate 140 can be driven by the thin film transistor of the first substrate 100. The aforementioned construction allows for an inverted-OLED in which the first electrode 150 is comprise a transparent conductive material, and has an advantage in providing high transmittance as a device of top emission type.

The thusly constructed organic light emitting device is driven when prescribed electrical signals are applied to the first and second electrodes through wiring or thin film transistor to thereby display images.

However, this organic light emitting device has provided the first electrode in the form of a stripe or full surface electrode using a transparent conductive film such as an ITO film which has a high work function. Accordingly, the sheet resistance of the first electrode increased and the transmission of signals to each pixel was delayed. In particular, the transmission of signals was severely delayed in case of large-area light emitting devices and thus desired images could not be displayed.

SUMMARY

The present invention provides an organic light emitting device including a first electrode disposed on of a first substrate. The first electrode includes an emission area and an non-emission area. A plurality of barrier ribs are located on a portion of the non-emission area of the first electrode, where each barrier rib has an overhang structure. Auxiliary electrodes are disposed on a portion of a lower part of the barrier ribs and electrically contact the first electrode. An emission layer is disposed on the emission area of the first electrode and a second electrode disposed is on the emission layer.

In another embodiment, a method of manufacturing an organic light emitting device includes providing a first substrate and forming a first electrode on the first substrate. A patterned conductive layer is formed on a portion of the first electrode and an insulating layer is formed on the patterned conductive layer. A portion of the insulating layer is etched to form barrier ribs, the barrier ribs having an overhang structure exposing a portion of the patterned conductive layer. The exposed portion of the patterned conductive layer is etched using the overhang structure as an etch mask to form auxiliary electrodes disposed on a portion of a lower part of the barrier ribs. An emission layer is formed on the first electrode exposed between the barrier ribs and a second electrode is formed on the emission layer.

In yet another embodiment an organic light emitting device includes a first electrode disposed on a first substrate, the first electrode including an emission area and a non-emission area. A barrier rib resides on the non-emission area of the first electrode, the barrier rib having an overhang structure. Auxiliary electrodes reside adjacent to opposing sides of the barrier rib between the overhang structure and the first electrode and electrically contact the first electrode and a light emitting diode is disposed on the emission area of the first electrode.

DETAILED DESCRIPTION

Figure 1A:
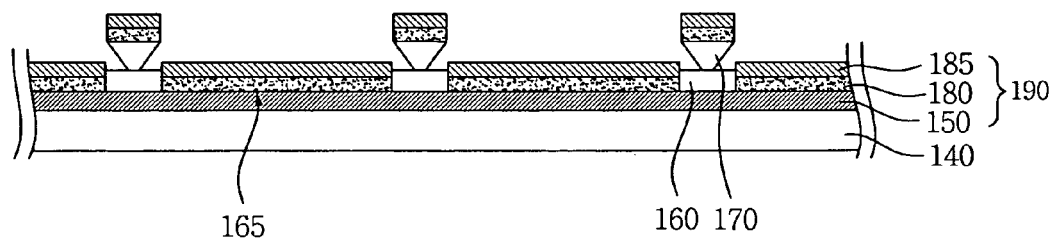
FIGS. 1A and 1B are cross sectional views of an organic light emitting device of a prior art.
Figure 1B:
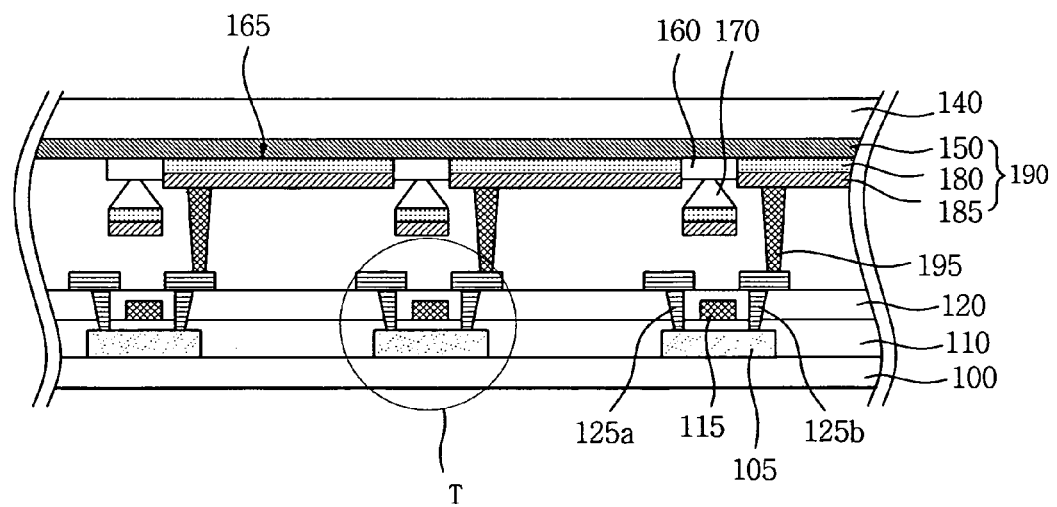

An embodiment of the present invention will be described with reference to the accompanying drawings. However, the present invention is not limited to an embodiment described below, but may be embodied in a variety of forms. In the drawings, if it is mentioned that a layer is positioned on a different layer or a substrate, the layer may be formed directly on the different layer or the substrate, or another layer may be interposed there between. Like reference numerals designate like elements.

Figure 2:
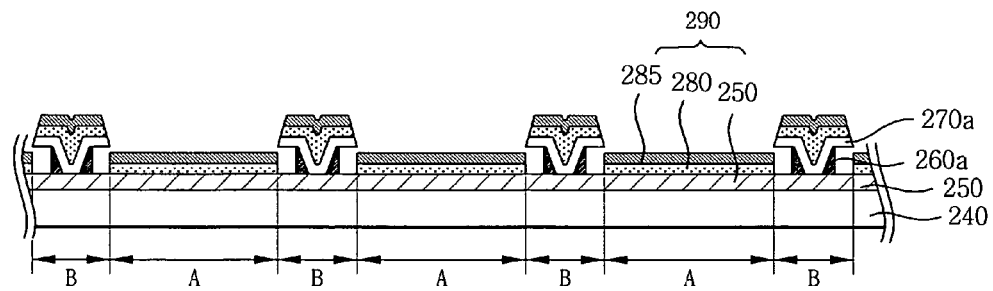
FIG. 2 is a cross sectional view of an organic light emitting device according to an embodiment of the present invention.

FIG. 2 is a cross sectional view of an organic light emitting device according to an embodiment of the present invention.

Referring to FIG. 2, a first electrode 250 is disposed on a substrate 240. The first electrode 250 comprises an emission area A and an non-emission area B. The first electrode 250 may be an anode. An auxiliary electrode 260a is disposed on a portion of the non-emission area B of the first electrode 250 and the auxiliary electrode 260 may comprise a material having lower resistance than the first electrode 250.

A barrier rib 270a is disposed between two auxiliary electrodes located on the non-emission area B of the first electrode 250 contacting two auxiliary electrodes 260a. The barrier rib 270a has an overhang structure and the height of the barrier rib 270a is more than the height of the auxiliary electrode 260a. Therefore, the auxiliary electrode 260a is disposed on the lower part of the barrier rib 270a.

An emission layer 280 is disposed on a portion of the emission area A of the first electrode 250, and a second electrode 285 is located on the emission layer 280. The emission layer 280 and the second electrode 285 are patterned by the under cut barrier rib 270a.

The emission layer 280 and the second electrode 285 are placed to be spaced from the auxiliary electrode 260a. The thickness of the auxiliary electrode 260 may be formed to be substantially equal to or more than the sum of the thicknesses of the emission layer 280 and the second electrode 285 so that the emission layer 280 and the second electrode 285 can be effectively patterned by the barrier rib 270a. A light emitting diode 290 including first electrode 250, emission layer 280, and second electrode 285 overlies emission area A of substrate 240.

FIGS. 3A to 3D are cross sectional views for illustrating each process of a method for manufacturing an organic light emitting device according to an embodiment of the present invention.

Figure 3A:
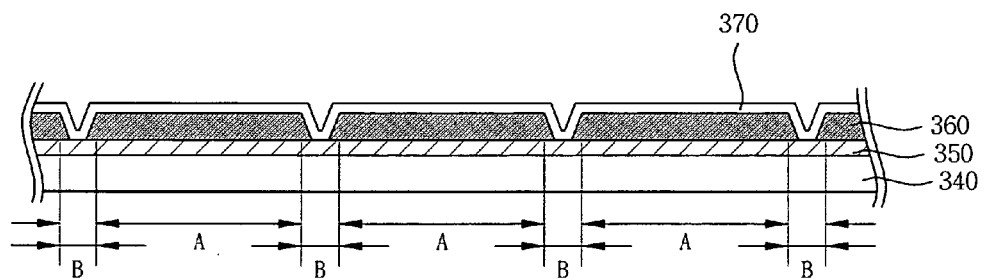
FIGS. 3A to 3D are cross sectional views illustrating a method for manufacturing an organic light emitting device according to an embodiment of the present invention.

Referring to FIG. 3A, a first electrode 350 is disposed on a substrate 340 comprising an emission area A and a non-emission area B. The first electrode 350 may be an anode and may comprise a transparent conductive material having high work function such as Indium Tin Oxide, Indium Zinc Oxide, Indium Cerium Oxide or Zinc Oxide. Although not shown here, the first electrode 350 can be formed in the form of stripes.

A conductive layer is deposited on the first electrode 350 and patterned to expose a portion of the first electrode 350. The patterned conductive layer 360 is for an auxiliary electrode. The patterned conductive layer 360 may comprise a material having lower resistance than the first electrode 350. For example, it can comprise Al, Mo, or Cr.

Next, an insulting layer 370 for a barrier rib is deposited on the substrate 340 including the patterned conductive layer 360. The insulating layer 370 may comprise an inorganic material such as a silicon nitride or a silicon oxide.

Figure 3B:
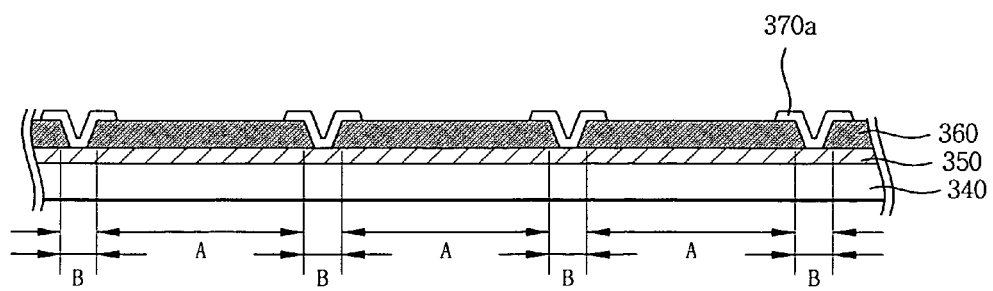

Referring to FIG. 3B, a barrier rib 370a is formed and a portion of the patterned conductive layer 360 is exposed by etching a portion of the insulating layer. At this time, photoresist is coated on the insulting film, then exposed and developed to create a photomask. The barrier rib 370a is formed by etching a portion of the insulating layer using the photomask.

Etching the portion of the insulating layer is performed by dry etching method. Dry etching method comprises ion beam etching, ion beam milling, sputtering, and RF etching.

Figure 3C:
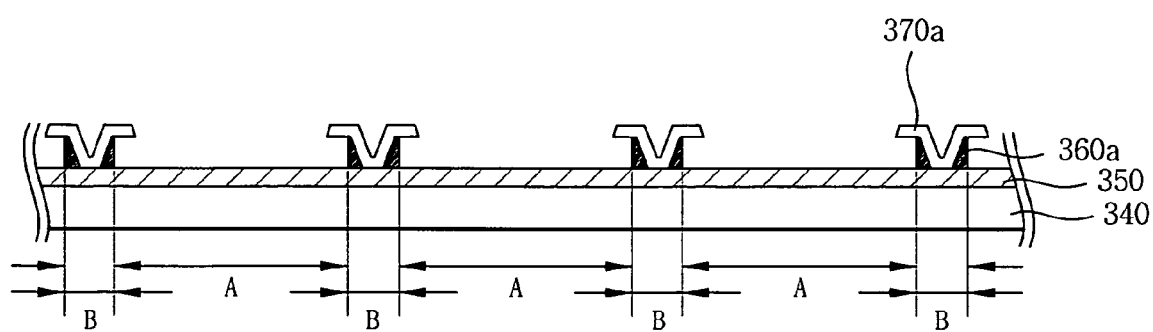

Referring to FIG. 3c, the auxiliary electrode 360a exposing the first electrode 350 is formed by etching the exposed patterned conductive layer. The auxiliary electrode 360a is located a portion of the lower part of the barrier rib 370a having an overhang structure and the barrier rib 370a is located between two auxiliary electrodes 130a contacting them. Etching the patterned conductive layer is performed by wet etching method using an etchant which contains water or acetic acid(CH3COOH) mixed with HNO3 and HF.

In general, the wet etching is an isotropic etching which has the same etching speed in the whole directions, and thus the patterned conductive layer for the auxiliary electrode is etched in the horizontal and vertical directions. In other words, the patterned conductive layer for the auxiliary electrode is under-cut when it is etched by wet etching.

Accordingly, the auxiliary electrode 360a is formed to be located on a portion of the lower part of the barrier rib 370a so that a portion of the first electrode 350 may be exposed.

Figure 3D:
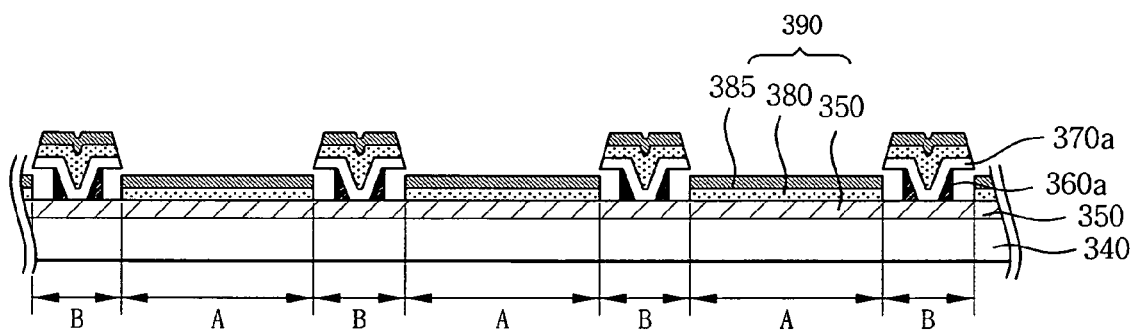

Referring to FIG. 3d, an emission layer 380 and a second electrode 385 are sequentially provided on the exposed first electrode 350 between the barrier ribs 370a. The emission layer 380 and the second electrode 385 are patterned by the under cut barrier rib 370a. In addition, the emission layer 380 and second electrode 385 are provided on the first electrode 350, while spaced from the auxiliary electrode 360a by a constant interval, because they are formed on a portion of the lower part of the barrier rib 370a. A light emitting diode 390 including first electrode 350, emission layer 380, and second electrode 385 overlies emission area A of substrate 340.

Therefore, an area where the auxiliary electrode 360a and the barrier rib 370a are located may be a non-emission area B and an area where the emission layer 380 and the second electrode 385 are located is an emission area A.

The thickness of the auxiliary electrode is substantially equal to or more than the sum of the thicknesses of the emission layer 380 and the second electrode 385 so that the emission layer 380 and the second electrode 385 can be effectively patterned by the barrier rib 370a.

As described above, the organic light emitting device according to an embodiment of the present invention comprises the auxiliary electrode 360a which comprises a material having lower resistance than the first electrode 350 on the first electrode 350. Therefore, sheet resistance of the first electrode 350 can be reduced, which allows delay of signal transmission to each pixel to be decreased.

In addition, the organic light emitting device according to another embodiment of the present invention provides both auxiliary electrode 360 and barrier rib 370 having an overhang structure, which allows the manufacturing processes to be facilitated and simplified.

Figure 4A:
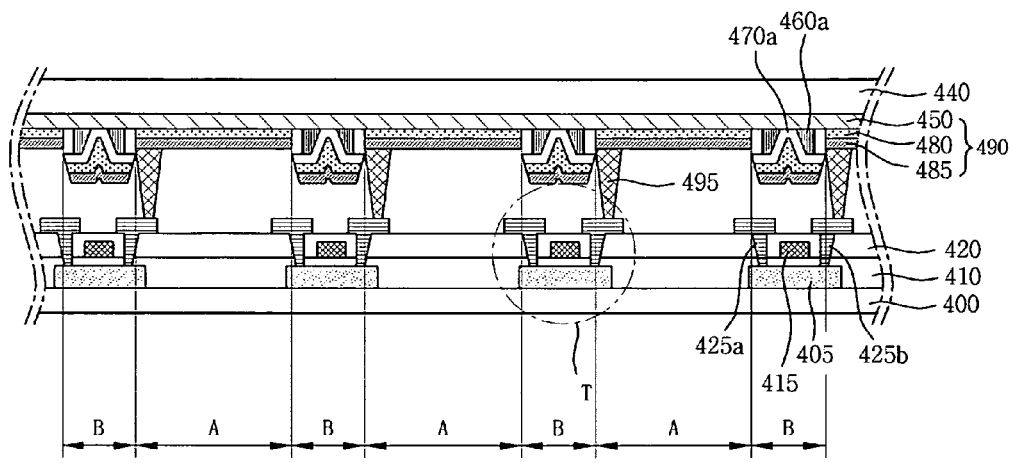
FIGS. 4A and 4B are cross sectional views and plan views illustrating an organic light emitting device according to other embodiments of the present invention.
Figure 4B:
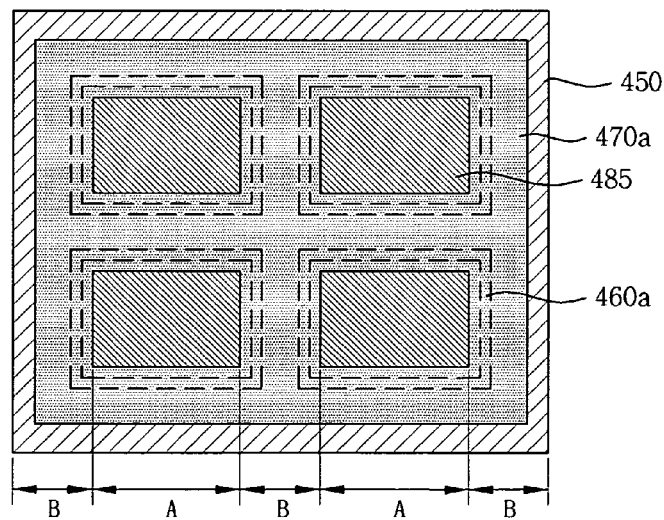

FIGS. 4A to 4B are a cross sectional view and a plan view for illustrating an organic light emitting device according to another embodiment of the present invention.

Referring to FIGS. 4A and 4B, a thin film transistor T comprising a semiconductor layer 405, a gate insulating layer 410, a gate electrode 415, a inter-insulating layer 420, a source electrode and a drain electrode 425a and 425b is disposed on a first substrate 400.

The semiconductor layer 405 may comprises amorphous silicon or polycrystalline silicon, and the gate insulating layer 410 is located on the first substrate 400 including the semiconductor layer 405. The gate electrode 415 is disposed on the gate insulating layer 410 to correspond to a portion of the semiconductor layer 405. The gate insulating electrode 415 can comprise Al, an Al alloy, Mo, a Mo alloy, W, or tungsten silicide (WSi2).

The inter-insulating layer 420 is disposed on the gate electrode 415 to insulate between the gate electrode 415, and source electrode and drain electrode 425a and 425b. The source electrode and drain electrode 425a and 425b may be electrically connected to a portion of the semiconductor layer 405 through the inter-insulating layer 420 and gate insulating layer 410. The source electrode and drain electrode 425a and 425b comprise a low-resistance material, such as Molybdenum-Tungsten (MoW), Titanium (Ti), Aluminum (Al), or an Aluminum alloy to reduce the resistance of wiring.

Meanwhile, a light emitting diode 490 comprising a first electrode 450, an emission layer 480, and a second electrode 485 is disposed on the second substrate 440. The first electrode 450 comprises an emission area A and a non-emission area B.

The first electrode 450 may be an anode, and as shown in FIG. 4B, the first electrode 450 may be a common electrode formed on the second substrate 440. An auxiliary electrode 460a is disposed on a portion of the non-emission area B of the first electrode 450. The auxiliary electrode 460a may comprise a material having lower resistance than the first electrode 450.

A barrier rib 470a is disposed on a portion of the first electrode 450 and between two auxiliary electrodes 460a contacting them. The barrier rib 470a has an overhang structure.

The barrier ribs 470a are arranged on the first electrode 450 in a lattice structure as shown in FIG. 4b, and each sub-pixel region can be defined by the barrier ribs 470a. Also, the auxiliary electrode 460a may be disposed on a portion of the lower part of the barrier rib 470 and outside of each sub-pixel region.

An emission layer 480 is disposed on a portion of the emission area A of the first electrode 450, and a second electrode 485 is located on the emission layer 480. The emission layer 480 and the second electrode 485 are patterned by the barrier rib 470a and located to be spaced from the auxiliary electrode 460a. It is desirable that the thickness of the auxiliary electrode 460a is substantially equal to or more than the sum of the thicknesses of the emission layer 480 and the second electrode 485 so that the emission layer 480 and the second electrode 485 can be effectively patterned.

The first substrate 400 comprising thin film transistors is attached to the second substrate comprising light emitting diodes 490. At this time, the drain electrode of the thin film transistor T and the second electrode of the light emitting diode 490 may be electrically connected to each other by the metal line 495. Hence, the light emitting diode 490 can be driven by the thin film transistor T.

As mentioned above, inverted-OLEDs have been problematic in that signal transmission was severely delayed because the first electrode 450 was a common electrode. However, the organic light emitting device according to the embodiment of the present invention comprise the auxiliary electrode 460a electrically connected to the first electrode 450 and located outside of each pixel portion. The auxiliary electrode 460a comprises a material having lower resistance than the first electrode 450. Therefore, the organic light emitting device according to the embodiment of the present invention can reduce sheet resistance of the first electrode, which allows delay of signal transmission to each pixel to be decreased effectively. And, the organic light emitting device according to the present invention can improve the quality of screen.

In addition, the organic light emitting device according to the embodiment of the present invention provides both auxiliary electrode 460 and barrier rib 470 having an undercut structure, which allows the manufacturing processes to be facilitated and simplified.

Although the present invention has been described with reference to certain exemplary embodiments, it will be understood by those skilled in the art that a variety of modifications and variations may be made to the present invention without departing from the spirit or scope of the present invention defined in the appended claims, and their equivalents.

What is claimed is:

1. An organic light emitting device comprising:
   a first electrode disposed on a first substrate, the first electrode comprising an emission area and a non-emission area;
   a plurality of barrier ribs located on a portion of the non-emission area of the first electrode, each barrier rib having an overhang structure;
   auxiliary electrodes disposed on and contacting the first electrode;
   an emission layer disposed on the emission area of the first electrode; and
   a second electrode disposed on the emission layer,
   wherein the barrier ribs have a shape of an undercut to form a space between the first electrode and the barrier ribs, the emission layer and the second electrode are patterned by the barrier ribs,
   wherein the auxiliary electrodes are formed in the space between the first electrode and the barrier ribs,
   wherein the auxiliary electrodes are contacted to side walls of barrier ribs.

2. The organic light emitting device of claim 1, further comprising a second substrate opposite the first substrate and having a plurality of thin film transistors thereon, each thin film transistor comprising a semiconductor layer, a gate electrode corresponding a portion of the semiconductor layer, a gate insulating layer disposed between the semiconductor layer and the gate electrode, and a source electrode and a drain electrode electrically connected to the semiconductor layer,
   wherein the drain electrode of the second substrate is electrically connected to the second electrode of the first substrate.

3. The organic light emitting device of claim 2, wherein the first electrode comprises an anode and a common electrode.

4. The organic light emitting device of claim 1, wherein the auxiliary electrodes comprise a material having a lower electrical resistance than the first electrode.

5. The organic light emitting device of claim 4, wherein the auxiliary electrodes comprise one or more materials selected from the group consisting of Al, Mo, and Cr.

6. The organic light emitting device of claim 1, wherein a thickness of the auxiliary electrodes is substantially equal to or greater than a sum of thicknesses of the emission layer and the second electrode.

7. The organic light emitting device of claim 1, wherein the first electrode comprises an anode.

8. The organic light emitting device of claim 1, wherein the barrier ribs are provided on the first electrode in a lattice structure to define a plurality of emission regions, and the barrier ribs and the auxiliary electrodes are located outside of the plurality of the emission regions.

9. The organic light emitting device of claim 1, wherein a lower part of the barrier ribs have a shape V.

* * * * *